(12) United States Patent
Takano

(10) Patent No.: US 7,157,308 B2
(45) Date of Patent: Jan. 2, 2007

(54) CIRCUIT SUBSTRATES, SEMICONDUCTOR DEVICES, SEMICONDUCTOR MANUFACTURING APPARATUS METHODS FOR MANUFACTURING CIRCUIT SUBSTRATES, AND METHODS FOR MANUFACTURING SEMICONDUCTOR DEVICES

(75) Inventor: Michiyoshi Takano, Chino (JP)

(73) Assignee: Seiko Epson Corporation (JP)

( * ) Notice: Subject to any disclaimer, the term of this patent is extended or adjusted under 35 U.S.C. 154(b) by 13 days.

(21) Appl. No.: 10/785,708

(22) Filed: Feb. 24, 2004

(65) Prior Publication Data

US 2004/0217456 A1    Nov. 4, 2004

(30) Foreign Application Priority Data

Feb. 26, 2003    (JP)    ............................. 2003-048816

(51) Int. Cl.
  *H01L 21/50* (2006.01)
  *H01L 21/48* (2006.01)
  *H01L 21/44* (2006.01)

(52) U.S. Cl. ...................... 438/106; 438/112; 438/123; 438/124; 438/127

(58) Field of Classification Search ................ 438/106, 438/112, 123–124, 127
  See application file for complete search history.

(56) References Cited

U.S. PATENT DOCUMENTS 6,472,305 B1 * 10/2002 Ozaki et al. ................ 438/613
6,561,743 B1 *  5/2003 Nakatsu ...................... 414/403

FOREIGN PATENT DOCUMENTS

| JP | 2001-035886 | 2/2001 |
| JP | 2001-223306 | 8/2001 |
| JP | 2001-298046 | 10/2001 |
| JP | 2002-009108 | 1/2002 |
| JP | 2002-124536 | 4/2002 |

OTHER PUBLICATIONS

Communication from Japanese Patent Office regarding related application.

* cited by examiner

*Primary Examiner*—Luan Thai
(74) *Attorney, Agent, or Firm*—Harness, Dickey & Pierce, P.L.C.

(57) ABSTRACT

A method is provided to control the height of bump electrodes and increase a clearance between edge sections of a semiconductor chip and lead terminals of a tape substrate. By applying suction to a tape substrate through a suction groove, boundary portions of a semiconductor chip mounting region are drawn into the suction groove, and curved sections are formed in the tape substrate at locations corresponding to edge sections of a semiconductor chip.

7 Claims, 16 Drawing Sheets ns, semiconductor devices, semiconductor manufacturing apparatus methods for manufacturing circuit substrates, and methods for manufacturing semiconductor devices

CIRCUIT SUBSTRATES, SEMICONDUCTOR DEVICES, SEMICONDUCTOR MANUFACTURING APPARATUS METHODS FOR MANUFACTURING CIRCUIT SUBSTRATES, AND METHODS FOR MANUFACTURING SEMICONDUCTOR DEVICES

RELATED APPLICATIONS

This application claims priority to Japanese Patent Application No. 2003-048816 filed Feb. 26, 2003 which is hereby expressly incorporated by reference herein in its entirety.

BACKGROUND OF THE INVENTION

1. Technical Field

The present invention relates to circuit substrates, semiconductor devices, semiconductor manufacturing apparatuses, methods for manufacturing circuit substrates, and methods for manufacturing semiconductor devices, and particularly, are favorably applied to FDB (face down bonding) in COF (chip on film).

2. Conventional Technology

In conventional semiconductor devices, for example, as described in Japanese Laid-open Patent Application 2001-298046, there is a method to realize FDB in COF through Au—Au bonding by application of heat and pressure.

FIGS. 16(a) and (b) are cross-sectional views showing a conventional method for manufacturing a semiconductor device.

Referring to FIG. 16(a), Cu wiring layers 112 as inner leads are formed on a tape substrate 111, the circumference of the Cu wiring layer 112 is covered by a protection film 113, and exposed portions of the Cu wiring layers 112 are covered by Au plated layers 114.

For example, a polyimide film can be used as the tape substrate 111; and for example, a solder resist can be used as the protection film 113.

On the other hand, pad electrodes 116 are provided on a semiconductor chip 115, the circumference of the pad electrodes 116 is covered by a protection film 117, and Au bump electrodes 118 having a height H2 are formed on the pad electrodes 116.

For example, Al can be used as the pad electrodes 116; and for example, a silicon oxide film or silicon nitride film can be used as the protection film 117.

When the semiconductor chip 115 is mounted on the tape substrate 111, the tape substrate 111 is mounted on a bonding stage 101 that is heated. Then, as indicated in FIG. 16(b), while retaining by suction the semiconductor chip by a bonding head 102, the Au bump electrodes 118 are pressed onto the Cu wiring layers 112 that are covered by the Au plated layers 114.

When the Au bump electrodes 118 are pressed against the Cu wiring layers 112 that are covered by the Au plated layers 114, the tape substrate 111 below the Au bump electrodes 118 recedes, and a clearance CL2 between edge sections of the semiconductor chip 115 and the Cu wiring layers 112 covered by the Au plated layers 114 is reduced, such that the edge sections of the semiconductor chip 115 may come in contact with the Au plated layers 114.

Accordingly, in the conventional semiconductor device, to prevent the edge sections of the semiconductor chip 115 from contacting the Au plated layers 114, the height H2 of the Au bump electrodes 118 is increased.

For example, when the semiconductor chip 115 is mounted on the tape substrate 111, the clearance CL2 between the edge sections of the semiconductor chip 115 and the Cu wiring layers 112 covered by the Au plated layers 114 becomes to be about 10–12 µm. Accordingly, in order to prevent the edge sections of the semiconductor chip 115 from contacting the Au plated layers 114, the height H2 of the Au bump electrodes 118 is set to about 22.5 µm.

However, increasing the height H2 of the Au bump electrodes 118 leads to an increase in the cost because about 400–500 Au bump electrodes 118 may be provided per semiconductor chip 115, and results in greater variations in the height H2 of the Au bump electrodes 118, which leads to a problem of deteriorated connection reliability of the Au bump electrodes 118.

Accordingly, it is an object of the present invention to provide circuit substrates, semiconductor devices, semiconductor manufacturing apparatuses, methods for manufacturing circuit substrates, and methods for manufacturing semiconductor devices, which can control the height of bump electrodes, and increase the clearance between edge sections of a semiconductor chip and lead terminals of a circuit substrate.

SUMMARY

To solve the problems described above, a circuit substrate according to a first aspect is characterized in comprising: a chip mounting region for mounting a chip; a mounting substrate formed to recede at a boundary of the chip mounting region; and lead terminals that are formed on the mounting substrate and lay over the chip mounting region.

Accordingly, without increasing the separation between the mounting substrate and the chip surface, the mounting substrate can be kept away from the edge sections of the chip.

Consequently, without increasing the height of the electrodes that connect the chip and the mounting substrate, the edge sections of the chip are prevented from contacting the mounting substrate, and the connection reliability between the chip and the mounting substrate can be improved.

Also, a semiconductor device according to a second aspect is characterized in comprising: a circuit substrate having lead terminals formed thereon; a semiconductor chip connected to the lead terminals through bump electrodes; and a concave section that is provided in the circuit substrate and disposed at a position corresponding to an edge position of the semiconductor chip.

Accordingly, the circuit substrate can be composed in a manner that the circuit substrate extends around and away from the edge section of the semiconductor chip, and the edge section of the semiconductor chip can be prevented from contacting the circuit substrate without increasing the height of the bump electrodes.

Consequently, the material used for the bump electrodes can be reduced, such that the cost can be lowered; and the uniformity in the height of the bump electrodes is improved such that the connection reliability between the semiconductor chip and the circuit substrate can be improved.

Also, a semiconductor device according to a third aspect is characterized in that the concave section is disposed at a position corresponding to a position at which the lead terminals and the edge position of the semiconductor chip are crossed.

Accordingly, by providing the concave section in the circuit substrate, the lead terminals on the circuit substrate can be kept away from the edge sections of the semiconductor chip, such that short-circuiting between the semiconductor chip and the lead terminals can be prevented even when the edge sections of the semiconductor chip come in contact with the circuit substrate.

Further, a semiconductor device according to a fourth aspect is characterized in that the concave section includes a region between the bump electrodes and the edge position of the semiconductor chip.

Consequently, even when variations occur in the location of the concave section, the mounting substrate can be kept away from the edge sections of the semiconductor chip, and the edge sections of the semiconductor chip can be prevented from contacting the circuit substrate, without affecting the height of the bump electrodes.

Also, a semiconductor manufacturing apparatus according to a fifth aspect is characterized in comprising: a bonding stage that supports a circuit substrate; a mounting device that mounts a semiconductor chip on the circuit substrate; at least one of a groove and a hole that is provided in the bonding stage at a position corresponding to the edge position of the semiconductor chip;

Accordingly, by mounting the circuit substrate on the bonding stage, the semiconductor chip can be mounted, and the concave section disposed at a location corresponding to the edge position of the semiconductor chip can be formed in the circuit substrate.

Consequently, while restraining the manufacturing process and the circuit substrate from becoming more complex, the clearance between the edge sections of the semiconductor chip and the lead terminals on the circuit substrate can be increased, and the height of the bump electrodes can be reduced, such that the cost can be reduced, the uniformity in the height of the bump electrodes can be improved, and the connection reliability between the semiconductor chip and the circuit substrate can be improved.

Also, a semiconductor manufacturing apparatus according to a sixth aspect is characterized in comprising: a suction device that is provided at the bonding stage to apply suction to the groove or the hole; and a suction control device that controls the suction timing by the suction device based on a heating state of the circuit substrate.

Accordingly, while avoiding the influence caused by deformation of the circuit substrate, the circuit substrate can be softened, and portions of the circuit substrate corresponding to the edge positions of the semiconductor chip can be drawn into the groove or the hole, such that the concave sections disposed at positions corresponding to the edge positions of the semiconductor chip can be effectively formed.

Also, a semiconductor manufacturing apparatus according to a seventh aspect is characterized in further comprising a heating device that locally heats a region in the circuit substrate corresponding to the edge position of the semiconductor chip.

Accordingly, while inhibiting the softening of the entire circuit substrate, regions corresponding to the edge positions of the semiconductor chip can be effectively softened; and while restraining deteriorations in the mounting accuracy of the semiconductor chip, the concave sections disposed at locations corresponding to the edge positions of the semiconductor chip can be effectively formed.

Also, a semiconductor manufacturing apparatus according to an eighth aspect is characterized in that the heating device is a laser irradiating device.

Accordingly, areas corresponding to the edge positions of the semiconductor chip can be locally softened, such that, while mounting of the semiconductor chip is made possible, the concave sections disposed at locations corresponding to the edge positions of the semiconductor chip can be effectively formed.

Further, a semiconductor manufacturing apparatus according to a ninth aspect is characterized in comprising: a bonding head that retains a semiconductor chip; a first temperature control device that control the temperature of the bonding head; a bonding stage that supports a tape substrate; a second temperature control device that controls the temperature of the bonding stage; at least one of a suction groove and a suction hole that is provided in the bonding stage and disposed at positions corresponding to edge positions of the semiconductor chip; a vacuum pump that applies suction to the suction groove or the suction hole; a clamp device that clamps the tape substrate; a first image recognition device that performs image recognition of the semiconductor chip; a second image recognition device that performs image recognition of the tape substrate; a first positioning device that positions the bonding stage in X·Y·θ directions based on a result of the image recognition by the second image recognition device; a second positioning device that positions the bonding head in X·Y·θ directions based on a result of the image recognition by the first and second image recognition devices; a first pressing device that presses the bonding stage against the tape substrate, after the bonding stage is positioned by the first positioning device; and a second pressing device that presses the semiconductor chip retained by the bonding head against the tape substrate, after the bonding head is positioned by the second positioning device.

Accordingly, while the tape substrate can be softened, the tape substrate can be accurately mounted on the bonding stage; and by drawing portions of the tape substrate into the groove or the hole formed in the bonding stage, the concave sections disposed at locations corresponding to the edge positions of the semiconductor chip can be accurately formed in the tape substrate.

Consequently, without deteriorating the mounting accuracy, the clearance between the edge sections of the semiconductor chip and the lead terminals of the tape substrate can be increased; and the height of the bump electrodes can be reduced such that the cost can be reduced, and the uniformity in the height of the bump electrodes can be improved such that he connection reliability between the semiconductor chip and the tape substrate can be improved.

Also, a semiconductor manufacturing apparatus according to a tenth aspect is characterized in that the groove or the hole includes a region between the bump electrodes provided on the semiconductor chip and the edge positions of the semiconductor chip.

Accordingly, even when variations occur in the location of the semiconductor chip, the circuit substrate can be kept away from the edge sections of the semiconductor chip, and the edge sections of the semiconductor chip can be prevented from contacting the circuit substrate, without affecting the height of the bump electrodes, Also, a semiconductor manufacturing apparatus according to an eleventh aspect is characterized in that the groove or the hole is chamfered or processed with corner rounding.

Accordingly, when a portion of the circuit substrate is drawn into the groove or the hole formed in the bonding stage, the circuit substrate can be prevented from being damaged.

Also, a method for manufacturing a semiconductor device according to a twelfth aspect is characterized in comprising: a step for supporting a back surface of a circuit substrate by using a bonding stage having at least one of a groove and a hole disposed at a position corresponding to an edge position of a semiconductor chip; a step of applying suction to the groove or the hole provided in the bonding stage; a step of mounting the semiconductor chip on the circuit substrate while applying suction to the groove or the hole; and a step of sealing with resin the semiconductor chip mounted on the circuit substrate.

Accordingly, the semiconductor chip can be mounted on the circuit substrate in a state in which the circuit substrate is fixed to the bonding stage, and the concave sections disposed at locations corresponding to the edge positions of the semiconductor chip can be accurately formed in the circuit substrate.

Consequently, the semiconductor chip can be accurately mounted on the circuit substrate, and the clearance between the edge sections of the semiconductor chip and the lead terminals of the circuit substrate can be increased, such that the connection reliability between the semiconductor chip and the circuit substrate can be improved, and poor contacts of the semiconductor chip can be reduced.

Also, a method for manufacturing a semiconductor device according to a thirteenth aspect is characterized in comprising: a step of coating resin in a region inside of inner leads on a circuit substrate; a step for supporting a back surface of the circuit substrate by using a bonding stage having at least one of a groove and a hole disposed at a position corresponding to an edge position of a semiconductor chip; a step of applying suction to the groove or the hole provided in the bonding stage; and a step of mounting the semiconductor chip on the circuit substrate while applying suction to the groove or the hole.

Accordingly, the semiconductor chip can be mounted on the circuit substrate in a state in which the circuit substrate is fixed to the bonding stage, and the concave sections disposed at locations corresponding to the edge positions of the semiconductor chip can be accurately formed in the circuit substrate; and by mounting the semiconductor chip on the circuit substrate, the semiconductor chip can be sealed with resin.

Accordingly, the manufacturing process is simplified, and the clearance between the edge sections of the semiconductor chip and the lead terminals on the circuit substrate can be increased, such that the connection reliability between the semiconductor chip and the circuit substrate can be improved, and poor contacts of semiconductor chips can be reduced.

Also, a method for manufacturing a semiconductor device according to a fourteenth aspect is characterized in comprising: a step for supporting a back surface of a circuit substrate by using a bonding stage having at least one of a groove and a hole disposed at positions corresponding to edge positions of a semiconductor chip; a step of mounting the semiconductor chip on the circuit substrate: and a step of applying suction to the groove or the hole provided in the bonding stage, after mounting the semiconductor chip.

Accordingly, while the semiconductor chip is allowed to be mounted on the circuit substrate, portions of the circuit substrate can be drawn into the groove or the hole provided in the bonding stage in a state in which the circuit substrate is sufficiently softened, and the concave sections disposed at locations corresponding to the edge positions of the semiconductor chip can be effectively formed in the circuit substrate.

Consequently, the clearance between the edge sections of the semiconductor chip and the lead terminals of the circuit substrate can be increased, and the height of the bump electrodes can be reduced such that the cost of the bump electrodes can be reduced; and the uniformity in the height of the bump electrodes can be improved such that the connection reliability between the semiconductor chip and the circuit substrate can be improved.

Also, a method for manufacturing a semiconductor device according to a fifteenth aspect is characterized in further comprising a step of heating the circuit substrate when applying suction to the groove or the hole.

Accordingly, the circuit substrate can be softened, and portions of the circuit substrate can be effectively drawn into the groove or the hole, such that the concave sections disposed at locations corresponding to the edge positions of the semiconductor chip can be effectively formed.

Also, a method for manufacturing a semiconductor device according to a sixteenth aspect is characterized in comprising: a step of transferring a circuit substrate having a concave section formed at a position corresponding to an edge position of a semiconductor chip; a step of mounting the semiconductor chip on the circuit substrate that has been transferred; and a step of sealing with resin the semiconductor chip that is mounted on the circuit substrate.

Accordingly, the semiconductor chip can be mounted by using the circuit substrate having the concave sections formed therein at locations corresponding to the edge positions of the semiconductor chip, and the clearance between the edge sections of the semiconductor chip and the circuit substrate can be increased.

Consequently, the edge sections of the semiconductor chip can be prevented from contacting the circuit substrate without increasing the height of the bump electrodes; and the material used for the bump electrodes can be reduced such that the cost can be reduced, and the uniformity in the height of the bump electrodes can be improved such that the connection reliability between the semiconductor chip and the circuit substrate can be improved.

Also, a method for manufacturing a semiconductor device according to a seventeenth aspect is characterized in comprising: a step of transferring a tape substrate; a step of clamping the transferred tape substrate; a step of performing image recognition of the tape substrate; a step of positioning a bonding stage that supports the tape substrate in X·Y·θ directions based on a result of the image recognition of the tape substrate; a step of pressing the positioned bonding stage against a back surface of the tape substrate; a step of applying suction to a region of a semiconductor chip corresponding to an edge position thereof through a groove or a hole provided in the bonding stage; a step of performing image recognition of the tape substrate pressed against the bonding stage and the semiconductor chip; a step of positioning a bonding head that retains the semiconductor chip in X·Y·θ directions based on a result of the image recognition of the tape substrate and the semiconductor chip; a step of pressing the semiconductor chip that is retained by the bonding head positioned against the tape substrate; a step of forming the tape substrate by using radiant heat radiated from the bonding head; a step of releasing pressing of the bonding head; a step of releasing pressing of the bonding stage; and a step of releasing the clamping.

Accordingly, the tape substrate can be accurately mounted on the bonding stage, and areas of the tape substrate adjacent to the edge positions of the semiconductor chip can be effectively softened.

Consequently, by drawing portions of the tape substrate into the groove or the hole formed in the bonding stage, deformations of the entire tape substrate can be inhibited, and the concave section disposed at locations corresponding to the edge positions of the semiconductor chip can be accurately formed in the tape substrate.

As a result, while suppressing deteriorations in the mounting accuracy and restraining the manufacturing process and the circuit substrate from becoming more complex, the clearance between the edge sections of the semiconductor chip and the lead terminals on the circuit substrate can be increased, and the height of the bump electrodes can be reduced, such that the cost can be reduced, the uniformity in the height of the bump electrodes can be improved, and the connection reliability between the semiconductor chip and the tape substrate can be improved.

Also, a method for manufacturing a circuit substrate according to an eighteenth aspect is characterized in comprising: a step of forming lead terminals on a mounting substrate; and a step of forming a concave section disposed at a position corresponding to an edge position of a semiconductor chip by metal-molding of the mounting substrate.

Accordingly, while restraining the manufacturing process and the circuit substrate from becoming more complex, the concave section disposed at locations corresponding to the edge positions of the semiconductor chip can be stably formed in the circuit substrate; and while suppressing deteriorations in the throughput, the clearance between the edge sections of the semiconductor chip and the lead terminals of the circuit substrate can be increased.

DETAILED DESCRIPTION

A semiconductor device and its manufacturing method in accordance with an embodiment of the present invention will be described below with reference to the accompanying drawings.

Figure 1:
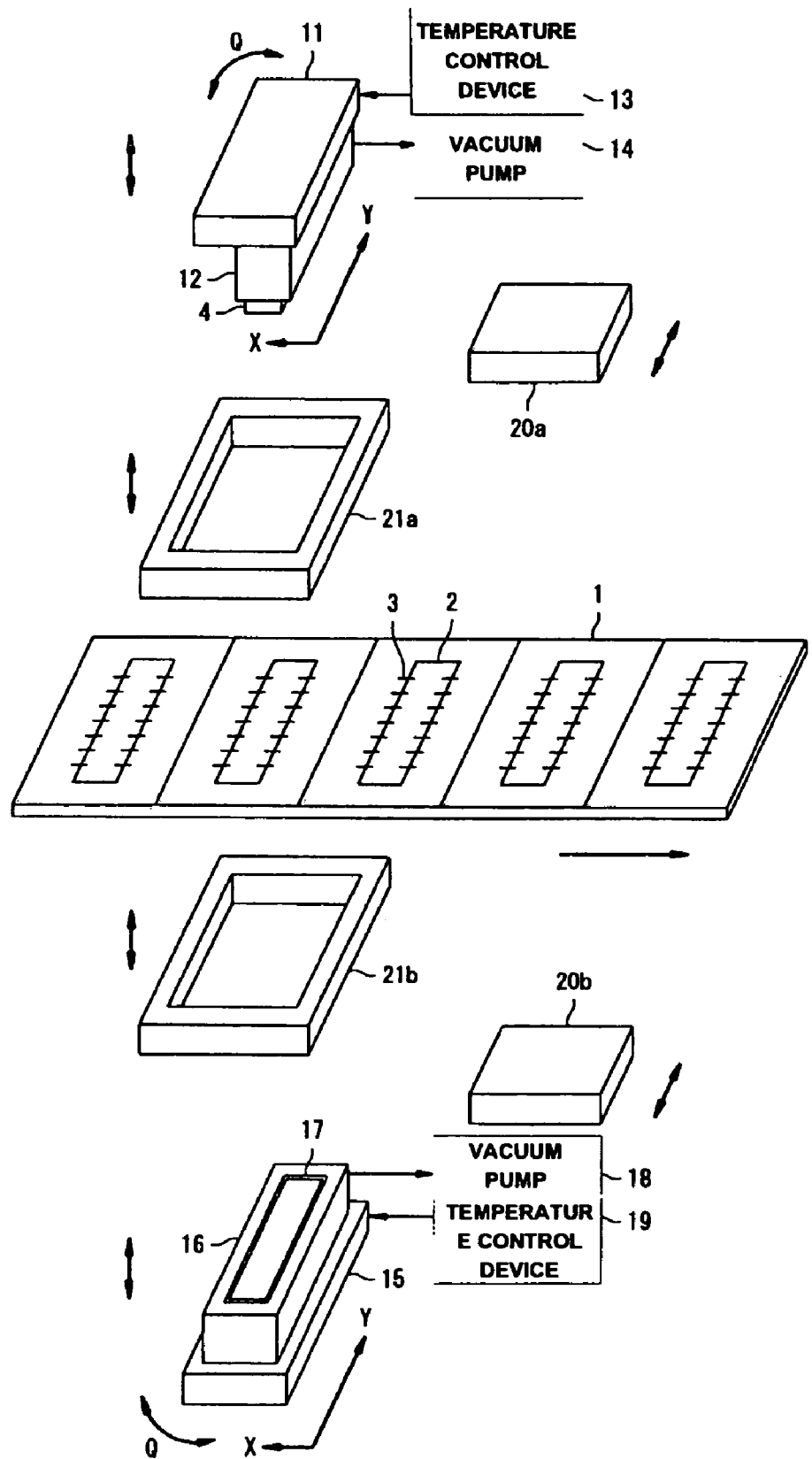
FIG. 1 schematically shows a perspective view of the structure of a semiconductor manufacturing device in accordance with a first embodiment of the present invention.

FIG. 1 schematically shows a perspective view of the structure of a semiconductor manufacturing device in accordance with a first embodiment of the present invention.

In FIG. 1, a tape substrate 1 is provided with a semiconductor chip mounting region 2 for mounting a semiconductor chip 4, and inner leads 3 formed in a manner to lie over the semiconductor chip mounting region 2. The tape substrate 1 can be composed of, for example a polyimide film, and the inner leads 3 can be composed of, for example, Cu wiring layers plated with Au.

Also, above the tape substrate 1, a bonding head 12 that sticks by suction to a semiconductor chip 4 is provided, and a heater 11 is attached to the bonding head 12. The bonding head 12 is connected to a vacuum pump 14 that applies suction to the semiconductor chip 4, and the heater 11 is connected to a temperature control device 13 that controls the temperature of the bonding head 12.

Further, above the tape substrate 1, a camera 20a that performs image recognition of the tape substrate 1 and the semiconductor chip 4 is provided, and the position of the bonding head 12 in its X and Y directions and rotation angle θ within the X-Y plane are controlled based on the image recognition result obtained by the camera 20a.

Further, below the tape substrate 1, a bonding stage 16 that fixes the semiconductor chip mounting region 2 of the tape substrate 1 is provided. A suction groove 17 is provided in the bonding stage 16, wherein the suction groove 17 is disposed at a position corresponding to the boundary of the semiconductor chip mounting region 2.

Further, the bonding stage 16 is connected to a vacuum pump 18 that applies suction to the suction groove 17, the bonding stage 16 is provided with a heater 15, and the heater 15 is connected to a temperature control device 19 that controls the temperature of the bonding stage 16.

Also, below the tape substrate 1, a camera 20b that performs image recognition of the tape substrate 1 is provided, and the position of the bonding stage 16 in its X and Y directions and rotation angle θ within the XY plane are controlled based on the image recognition result obtained by the camera 20b.

Further, above and below the tape substrate 1, tape pressing frames 21a and 21b are provided, respectively, which clamp the tape substrate 1 by sandwiching circumferential areas around the semiconductor chip mounting region 2 from above and below.

It is noted that, in the embodiment shown in FIG. 1, one method in which the suction groove 17 is provided on the bonding stage 16 is indicated. However, suction holes may be disposed at locations corresponding to the boundary of the semiconductor chip mounting region 2, and the suction groove or the suction holes may be disposed at areas corresponding to the regions where the inner leads 3 are present.

Figure 2:
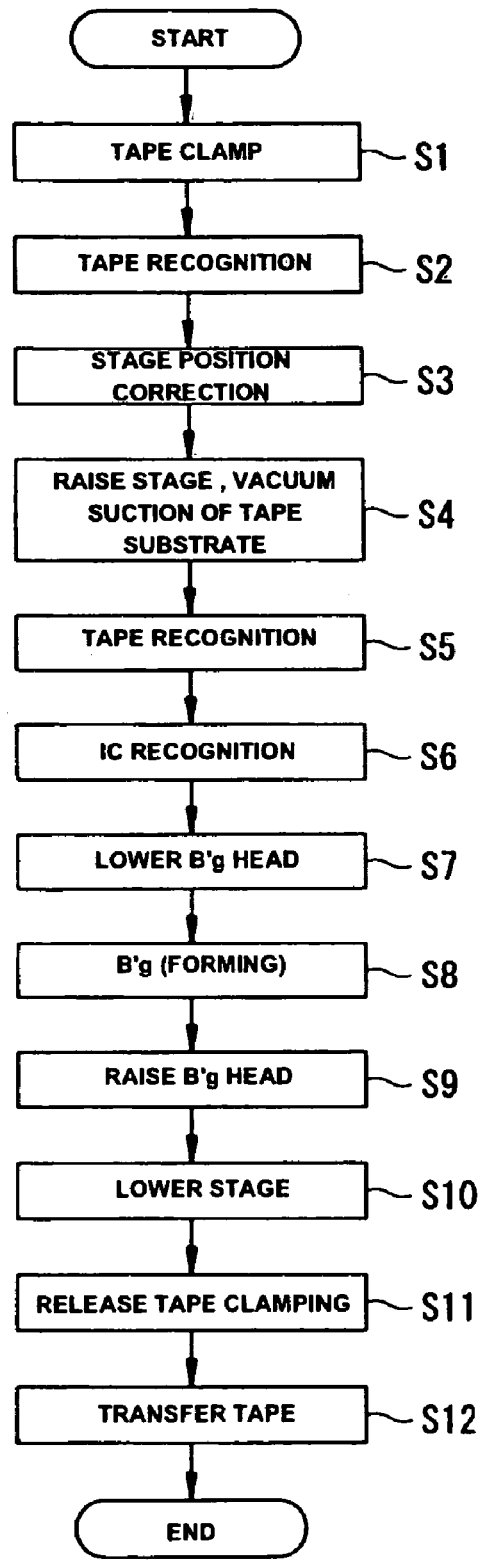
FIG. 2 is a flowchart indicating a method for manufacturing a semiconductor device in accordance with the first embodiment of the present invention.

FIG. 2 is a flowchart indicating a method for manufacturing a semiconductor device in accordance with the first embodiment of the present invention.

Referring to FIG. 2, the heater 11 is turned on, and the temperature of the bonding head 12 is adjusted by the temperature control device 13; and the vacuum pump 14 is turned on, such that the semiconductor chip 4 is sucked and retained by the bonding head 12. Also, the heater 15 is turned on, and the temperature of the bonding stage 16 is controlled by the temperature control device 19.

Then, when the tape substrate 1 is transferred, the tape pressing frame 21a is lowered, and the tape pressing frame 21b is raised, to thereby sandwich the circumference area around the semiconductor chip mounting region 2 from above and below, to thereby clamp the tape substrate 1 (step S1).

Here, by clamping the tape substrate 1 by using the tape pressing frames 21a and 21b, the semiconductor chip mounting region 2 of the tape substrate 1 can be fixed flat without supporting the tape substrate 1 by the bonding stage 16.

Consequently, the image recognition of the tape substrate 1 can be accurately conducted, and the positioning of the bonding stage 16 can be accurately conducted. Also, since the bonding stage 16 can be moved in its θ direction, positional deviations of the tape substrate 1 in the θ direction can also be accommodated.

Next, when the positioning of the bonding stage 16 is completed, the bonding stage 16 is raised, and the bonding stage 16 is pressed against the back surface of the tape substrate 1; and the vacuum pump 18 is turned on, to apply suction to the tape substrate 1 (step S4).

Here, since the suction groove 17 is disposed at a location corresponding to the boundary of the semiconductor chip mounting region 2, the boundary area of the semiconductor chip mounting region 2 of the tape substrate 1 can be effectively suctioned.

Next, the camera 20a is moved into the frame of the tape pressing frame 21a, and image recognition of the tape substrate 1 and the semiconductor chip 4 is conducted by using the camera 20a (step S5, S6). Then, based on the image recognition result of the tape substrate 1 and the semiconductor chip 4, the position of the bonding head 12 is aligned in its X·Y·θ directions.

Next, when the positioning of the bonding head 12 is complete, the bonding head 12 is lowered, and the semiconductor chip 4 that is retained by suction by the bonding stage 16 is mounted on the tape substrate 1 (step S7).

Next, by using radiant heat radiating from the bonding head 12, the tape substrate 1 is softened, and a boundary area of the semiconductor chip mounting region 2 that is suctioned at the suction groove 17 is drawn into the suction groove 17, such that the boundary position of the semiconductor chip mounting region 2 is curved (step S8).

By curving the boundary position of the semiconductor chip mounting region 2, the tape substrate 1 can be kept away from the edge sections of the semiconductor chip 4 when the semiconductor chip 4 is mounted on the tape substrate 1, and the clearance between the edge sections of the semiconductor chip 4 and the tape substrate 1 can be increased.

Also, by using radiant heat radiating from the bonding head 12, the boundary area of the semiconductor chip mounting region 2 can be effectively softened, such that deformation of the entire tape substrate 1 by heat can be inhibited, and deterioration of the mounting accuracy of the semiconductor chip 4 can be suppressed.

Next, when the forming of the tape substrate 1 is completed, the bonding head 12 is raised (step S9), and the bonding stage 16 is lowered (step S10), such that the clamping of the tape substrate 1 is released (step S11), and the tape substrate 1 is transferred (step S12).

It is noted that the timing of vacuum suction by the suction groove 17 can be adjusted in view of the softened state and/or deformed state of the tape substrate 1.

Figure 3:
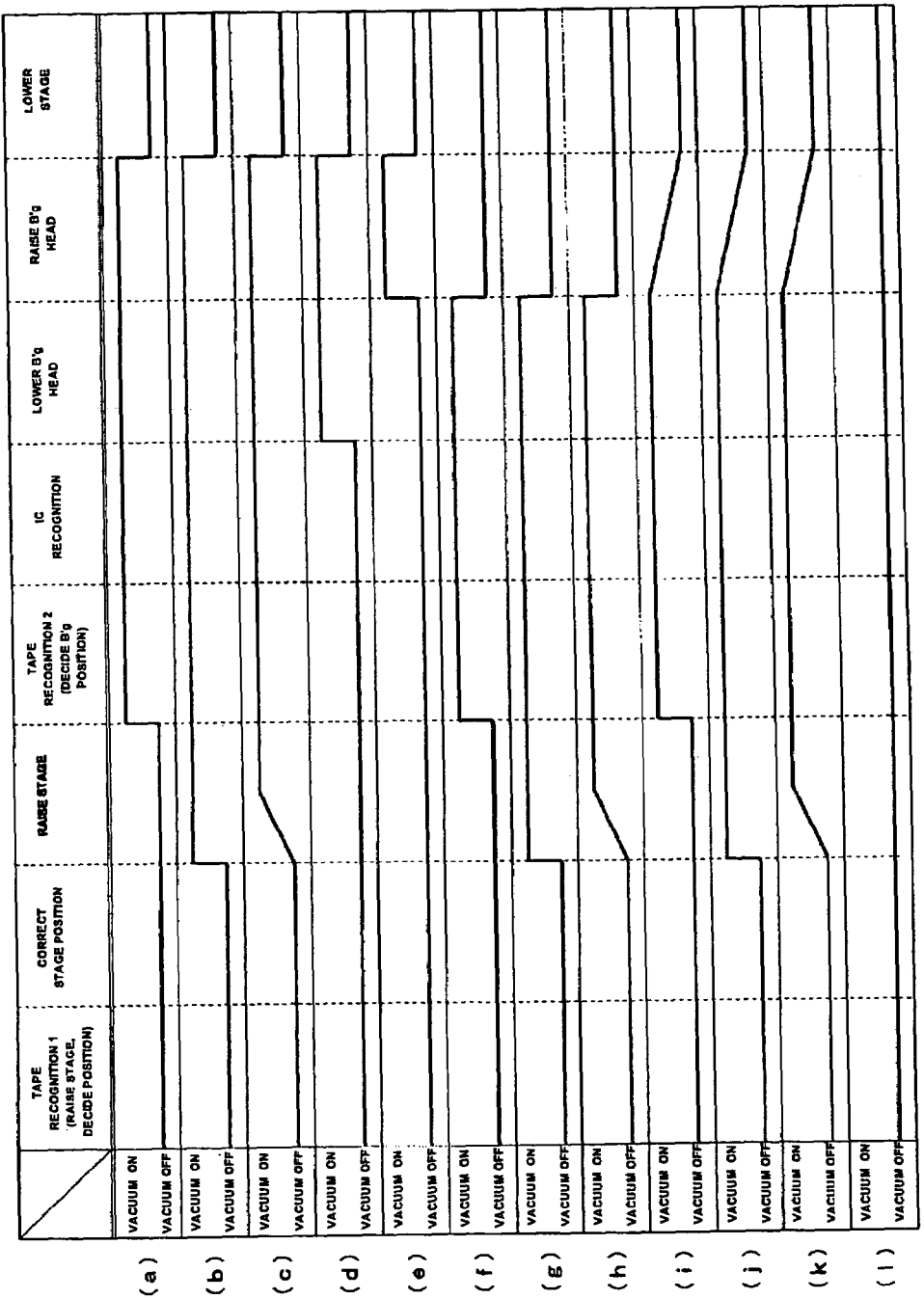
FIG. 3 is a timing chart indicating timings of vacuum suction in accordance with an embodiment of the present invention.

FIG. 3 is a timing chart indicating various examples of timings of vacuum suction in accordance with an embodiment of the present invention.

Referring to FIG. 3(a), after the bonding stage 16 is raised, and before image recognition of the tape substrate 1 is conducted, vacuum suction is applied to the tape substrate 1 through the suction groove 17; and then, after the bonding head 12 is raised, and before the bonding stage 16 is lowered, the vacuum suction is released.

Accordingly, image recognition of the tape substrate 1 can be conducted in a state in which the tape substrate 1 is fixed on the bonding stage 16, such that the positioning accuracy of the bonding stage 16 can be improved.

Next, referring to FIG. 3(b), after the positioning of the bonding stage 16 is finished, and before the bonding stage 16 is raised, vacuum suction is applied to the tape substrate 1 through the suction groove 17; and then after the bonding head 12 is raised, and before the bonding stage 16 is lowered, the vacuum suction is released.

Consequently, before the tape substrate 1 starts deforming by the heat of the bonding stage 16, the tape substrate 1 can be fixed onto the bonding stage 16, and image recognition of the tape substrate 1 can be performed in a state in which the tape substrate 1 is affixed to the bonding stage 16, such that the positioning accuracy of the bonding stage 16 can be further improved.

As indicate in FIG. 3(c), while the bonding stage 16 is raised as in FIG. 3(b), vacuum suction can be applied to the tape substrate 1.

Next, referring to FIG. 3(d), after image recognition of the semiconductor chip 4 is performed, and before the bonding head 12 is lowered, vacuum suction is applied to the tape substrate 1 through the suction groove 17; and after the bonding head 12 is raised, and before the bonding stage 16 is lowered, the vacuum suction is released.

Consequently, while the tape substrate 1 is softened by radiant heat radiating from the bonding head 12, portions of the tape substrate 1 can be drawn into the suction groove 17, such that the tape substrate 1 can be effectively curved at portions corresponding to the edge sections of the semiconductor chip 4.

Next, referring to FIG. 3(e), after the bonding head 12 is lowered, and before the bonding head 12 is raised, vacuum suction is applied to the tape substrate 1 through the suction groove 17; and after the bonding head 12 is raised, and before the bonding stage 16 is lowered, the vacuum suction is released.

Consequently, while the tape substrate 1 is softened by radiant heat radiating from the bonding head 12, portions of the tape substrate 1 can be drawn into the suction groove 17, such that the tape substrate 1 can be effectively curved at portions corresponding to the edge sections of the semiconductor chip 4.

As indicated in FIG. 3(f) through FIG. 3(h), after the bonding head 12 is lowered, as in FIG. 3(a) through FIG. 3(c), and before the bonding head 12 is raised, the vacuum suction can be released. Alternatively, as indicated in FIG. 3(i) through FIG. 3(k), the vacuum suction can be released while raising the bonding head 12.

Consequently, the amount of radiant heat from the bonding head 12 radiated onto the tape substrate 1 can be controlled, such that the amount of portions of the tape substrate 1 drawn into the suction groove 17 can be readily adjusted.

Also, as indicated in FIG. 3(l), without applying vacuum suction to the tape substrate 1 so as to be drawn into the suction groove 17, portions of the tape substrate 1 can be bent toward the suction groove 17 by the radiant heat of the bonding head 12.

Figure 4:
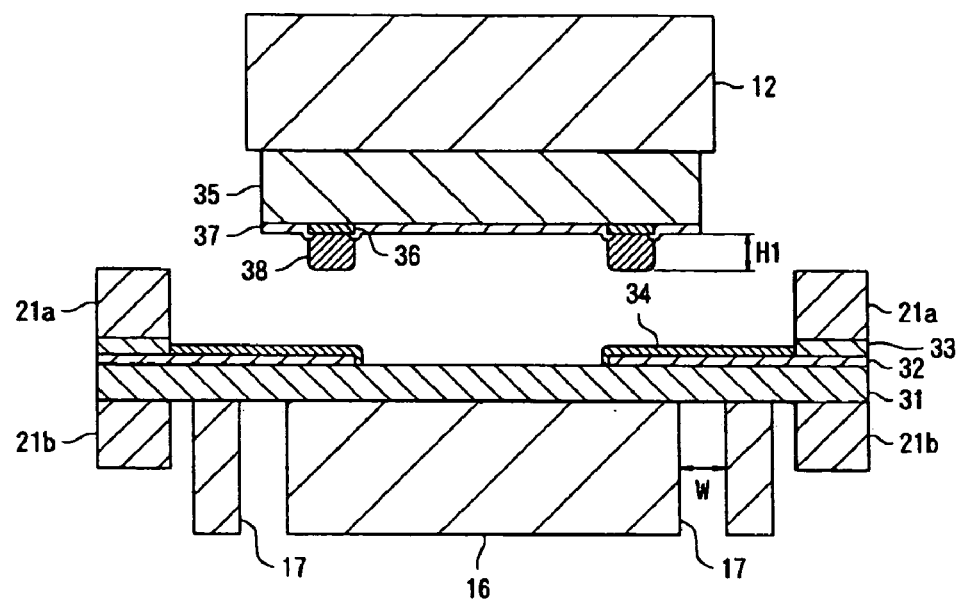
FIGS. 4(a) and (b) are cross-sectional views indicating a method for manufacturing a semiconductor device in accordance with a second embodiment of the present invention.
Figure 4:
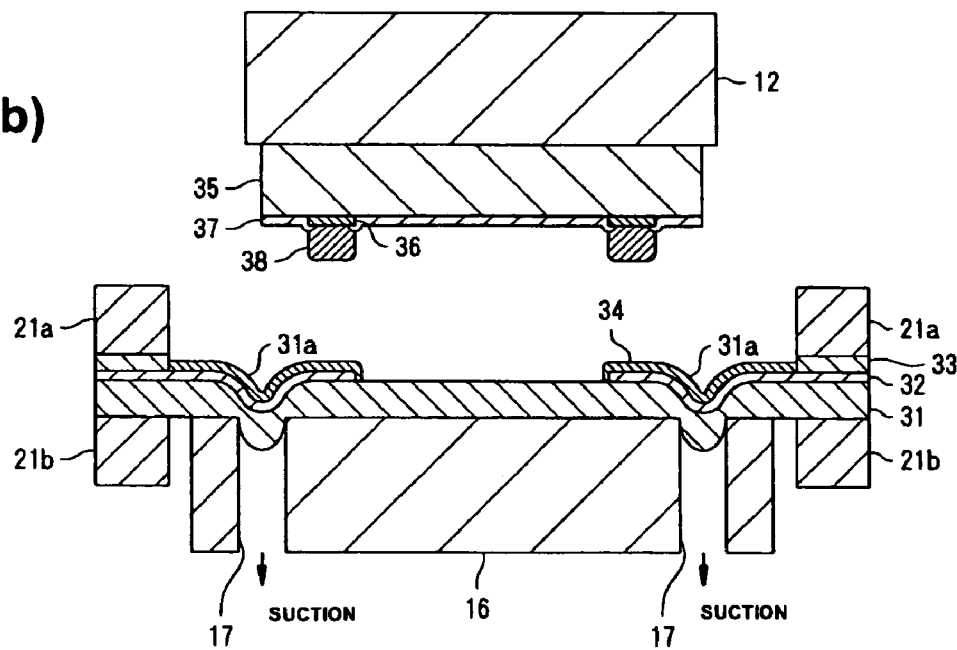
Figure 5:
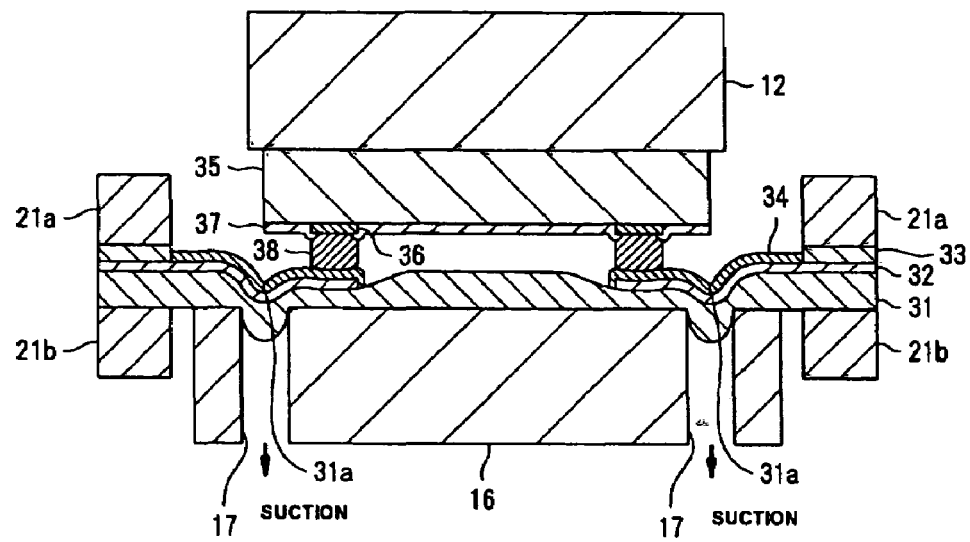
FIGS. 5(a)–(c) are cross-sectional views indicating the method for manufacturing a semiconductor device in accordance with the second embodiment of the present invention.
Figure 5:
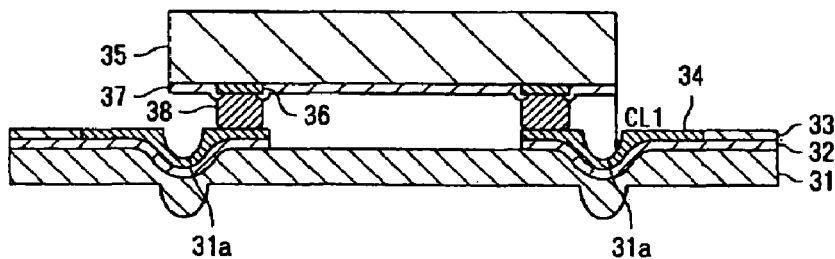
Figure 5:
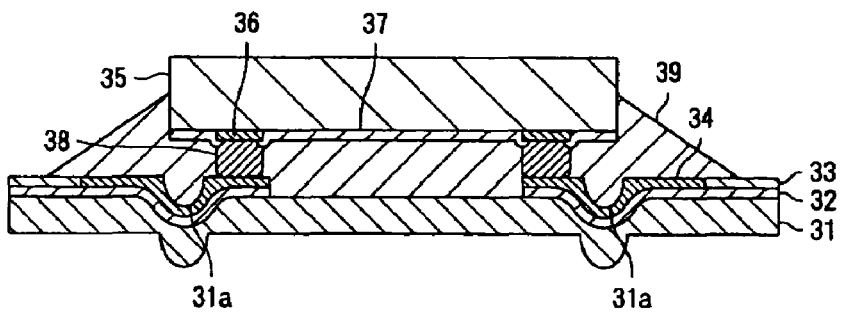

FIGS. 4 and 5 are cross-sectional views indicating a method for manufacturing a semiconductor device in accordance with a second embodiment of the present invention.

Referring to FIG. 4(a), Cu wiring layers 32 as inner leads are formed on a tape substrate 31, the circumference of the Cu wiring layer 32 is covered by a protection film 33, and exposed portions of the Cu wiring layers 32 are covered by Au plated layers 34.

For example, a polyimide film can be used as the tape substrate 31; and for example, a solder resist can be used as the protection film 33.

On the other hand, pad electrodes 36 are provided on a semiconductor chip 35, the circumference of the pad electrodes 36 is covered by a protection film 37, and Au bump electrodes 38 having a height H1 are formed on the pad electrodes 36.

For example, Al can be used as the pad electrodes 36; and for example, a silicon oxide film or silicon nitride film can be used as the protection film 37. Also, instead of the Au bump electrodes 38, Cu bump electrodes or Ni bump electrodes that are processed with coating such as Au plating or solder plating, or solder bumps may be used.

Then, when the tape substrate 31 is transferred, the tape pressing frame 21a is lowered, and the tape pressing frame 21b is raised, thereby clamping the tape substrate 31.

Then, while the bonding stage 16 is heated by the heater 15, the bonding stage 16 is pressed against the tape substrate 31, to thereby soften the tape substrate 31.

When pressing the bonding stage 16 against the tape substrate 31, the bonding stage 16 is positioned such that edge sections of the semiconductor chip 35 are positioned over the suction groove 17.

Here, by clamping the tape substrate 21 by using the tape pressing frames 21a and 21b, the tape substrate 1 can be fixed flat without supporting the tape substrate 1 by the bonding stage 16, such that the bonding stage 16 can be accurately positioned.

Also, the suction groove 17 can be disposed at positions where the tape surface on which Au bump electrodes 38 are disposed does not recede, and the tape surface can recede at the edge sections of the semiconductor chip 35. For example, a region between the Au bump electrodes 38 and the edge positions of the semiconductor chip 35 may be disposed over the suction groove 17. Also, instead of the suction groove 17, suction holes may be provided, or suction grooves and suction holes may be mixed and disposed.

Then, as indicated in FIG. 4(b), by applying suction to the tape substrate 31 through the suction groove 17, boundary portions of the semiconductor chip mounting region are drawn into the suction groove 17, such that curved portions 31a are formed in the tape substrate 31 at positions corresponding to the edge sections of the semiconductor chip 35.

Then, as indicated in FIG. 5(a), the semiconductor chip 35 that is retained by suction by the bonding head 12 is transferred onto the tape substrate 31, and the Au bump electrodes 38 are pressed against the Cu wiring layers 32 that are covered with the Au plated layers 34, to thereby bond the Au bump electrodes 38 to the Au plated layers 34.

Then, as indicated in FIG. 5(b), the bonding head 12 and the bonding stage 16 are removed, and the clamping by the tape pressing frames 21a and 21b is released.

Then, as indicate in FIG. 5(c), resin 39 is injected in areas surrounding the semiconductor chip 35 that is mounted on the tape substrate 31, to thereby seal the semiconductor chip 35.

Here, since the curved portions 31a are formed in the tape substrate 31 at locations corresponding to the edge sections of the semiconductor chip 35, the tape substrate 31 can escape in a manner that the tape substrate 31 can be kept away from the edge sections of the semiconductor chip 35. Accordingly, even when the tape substrate 31 recedes at areas below the Au bump electrodes 38, a clearance CL1 between the edge sections of the semiconductor chip 35 and the tape substrate 31 can be secured.

Also, before the semiconductor chip 35 is mounted on the tape substrate 31, suction is applied to the tape substrate 31 through the suction groove 17. Consequently, the semiconductor chip 35 can be mounted on the tape substrate 31 in a state in which the tape substrate 31 is fixed on the bonding stage 16, and the curved portions 31a can be accurately formed in the tape substrate 31.

Consequently, the semiconductor chip 35 can be accurately mounted on the circuit substrate 31 and the height H1 of the Au bump electrodes 38 can be lowered, such that the cost can be lowered, and the connection reliability between the semiconductor chip 35 and the tape substrate 31 can be improved, and poor contacts of the semiconductor chip 35 can be reduced.

Figure 6:
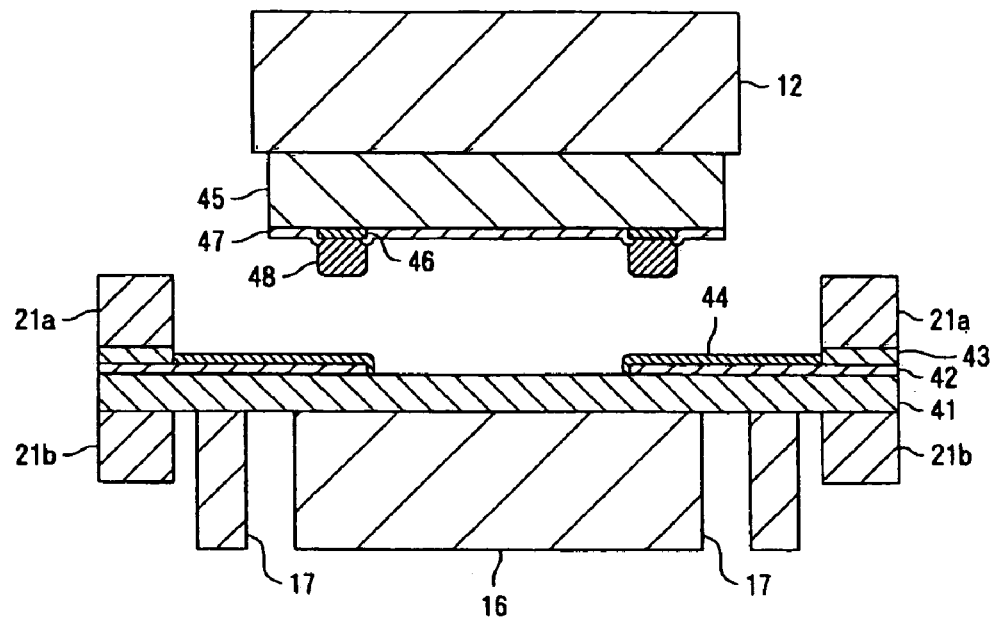
FIGS. 6(a) and (b) are cross-sectional views indicating a method for manufacturing a semiconductor device in accordance with a third embodiment of the present invention.
Figure 6:
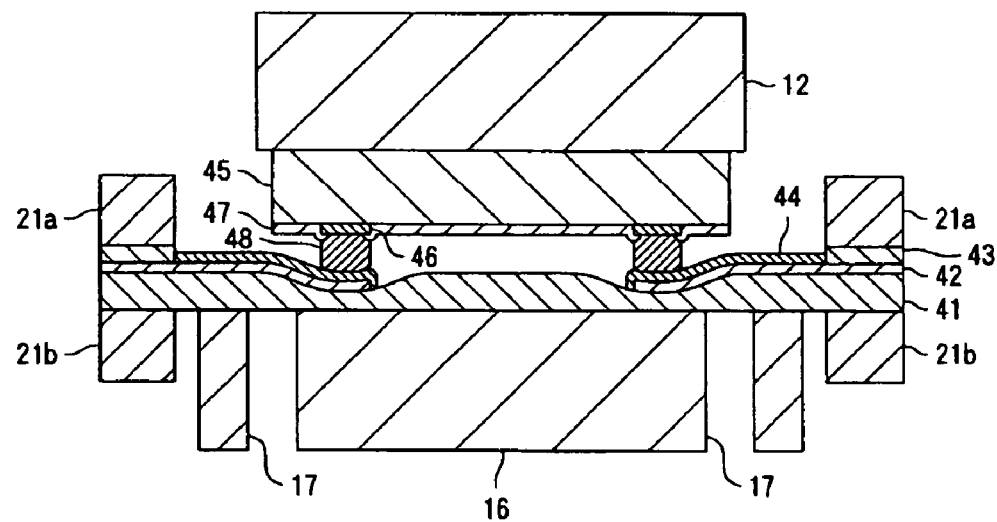
Figure 7:
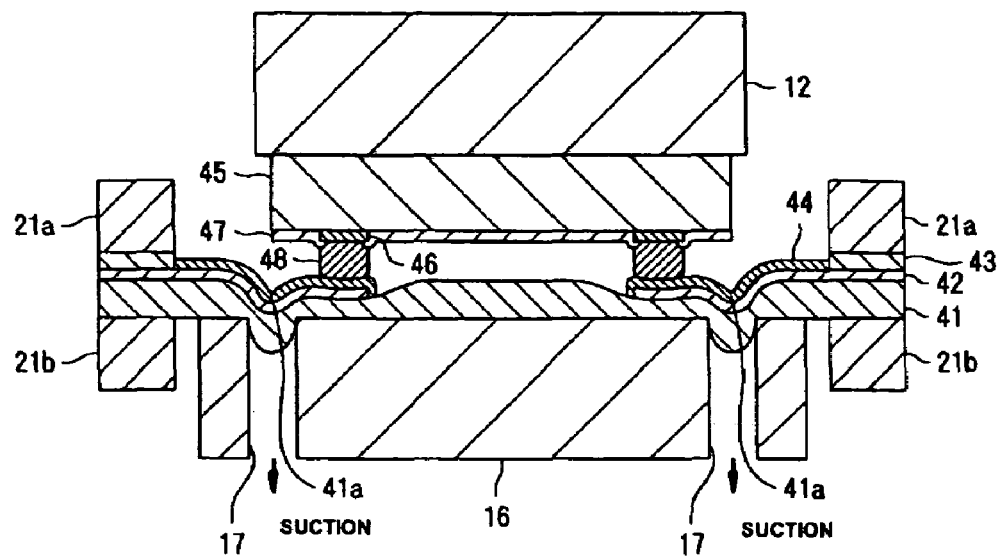
FIGS. 7(a)–(c) are cross-sectional views indicating the method for manufacturing a semiconductor device in accordance with the third embodiment of the present invention.
Figure 7:
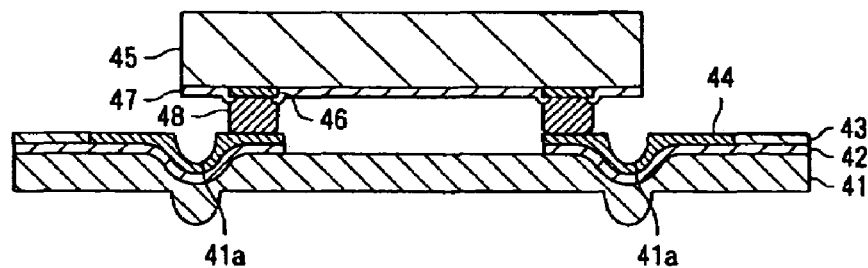
Figure 7:
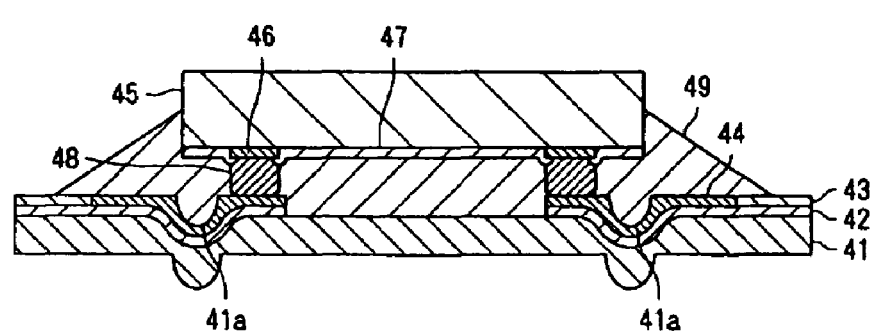

FIGS. 6 and 7 are cross-sectional views indicating a method for manufacturing a semiconductor device in accordance with a third embodiment of the present invention.

Referring to FIG. 6(a), Cu wiring layers 42 as inner leads are formed on a tape substrate 41, the circumference of the Cu wiring layer 42 is covered by a protection film 43, and exposed portions of the Cu wiring layers 42 are covered by Au plated layers 44.

On the other hand, pad electrodes 46 are provided on a semiconductor chip 45, the circumference of the pad electrodes 46 is covered by a protection film 47, and Au bump electrodes 48 are formed on the pad electrodes 46.

Then, when the tape substrate 41 is transferred, the tape pressing frame 21a is lowered, and the tape pressing frame 21b is raised, thereby clamping the tape substrate 41.

Then, while the bonding stage 16 is heated by the heater 15, the bonding stage 16 is pressed against the tape substrate 41, to thereby soften the tape substrate 41.

When pressing the bonding stage 16 against the tape substrate 41, the bonding stage 16 is positioned such that edge sections of the semiconductor chip 45 are positioned over the suction groove 17.

Then, as indicated in FIG. 6(b), the semiconductor chip 45 that is retained by suction by the bonding head 12 is transferred onto the tape substrate 41, and the Au bump electrodes 48 are pressed against the Cu wiring layers 42 that are covered with the Au plated layers 44, to thereby bond the Au bump electrodes 48 to the Au plated layers 44.

Then, as indicated in FIG. 7(a), by applying suction to the tape substrate 41 through the suction groove 17, boundary portions of the semiconductor chip mounting region are drawn into the suction groove 17, such that curved portions 41a are formed in the tape substrate 41 at positions corresponding to the edge sections of the semiconductor chip 45.

Then, as indicated in FIG. 7(b), the bonding head 12 and the bonding stage 16 are removed, and the clamping by the tape pressing frames 21a and 21b is released.

Then, as indicate in FIG. 7(c), resin 49 is injected in areas around the semiconductor chip 45 that is mounted on the tape substrate 41, to thereby seal the semiconductor chip 45.

Here, since the curved portions 41a are formed in the tape substrate 41 at locations corresponding to the edge sections of the semiconductor chip 45, even when the tape substrate 41 recedes at areas below the Au bump electrodes 48, a clearance between the edge sections of the semiconductor chip 45 and the tape substrate 41 can be secured.

Also, after the semiconductor chip 45 is mounted on the tape substrate 41, portions of the tape substrate 41 can be drawn into the suction groove 17 by applying suction to the tape substrate 41 through the suction groove 17, in a state in which the tape substrate 17 is sufficiently softened, and the curved sections 41a disposed at locations corresponding to the edge positions of the semiconductor chip 45 can be effectively formed in the tape substrate 41.

Consequently, the clearance between the edge sections of the semiconductor chip 45 and the tape substrate 41 can be increased, and the height of the Au bump electrodes 48 can be reduced, such that the cost of the Au bump electrodes 48 can be reduced, the uniformity in the height of the Au bump electrodes 48 can be improved, and the connection reliability between the semiconductor chip 45 and the tape substrate 41 can be improved.

Figure 8:
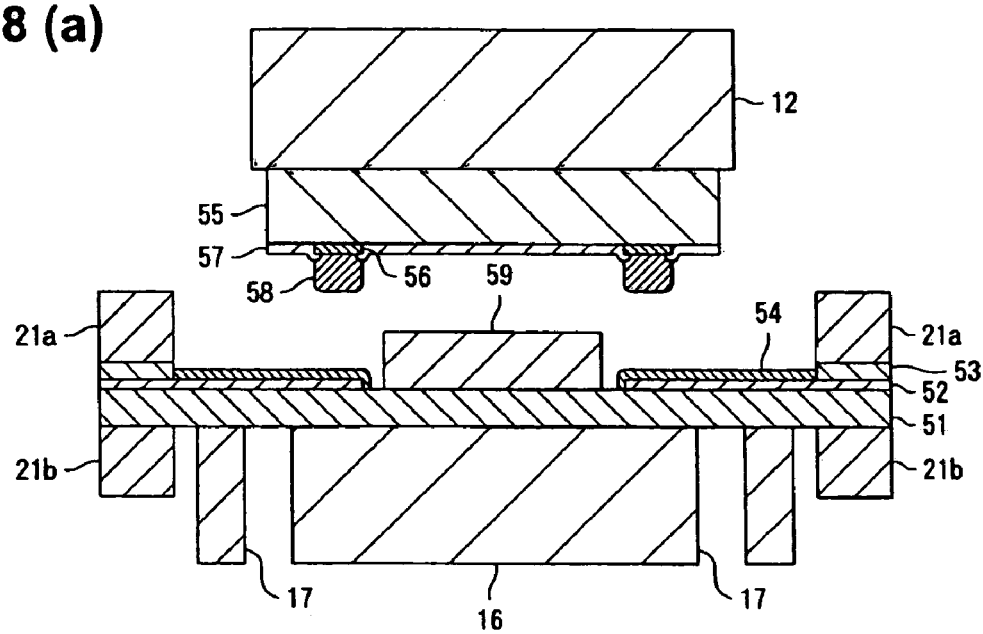
FIGS. 8(a) and (b) are cross-sectional views indicating a method for manufacturing a semiconductor device in accordance with a fourth embodiment of the present invention.
Figure 8:
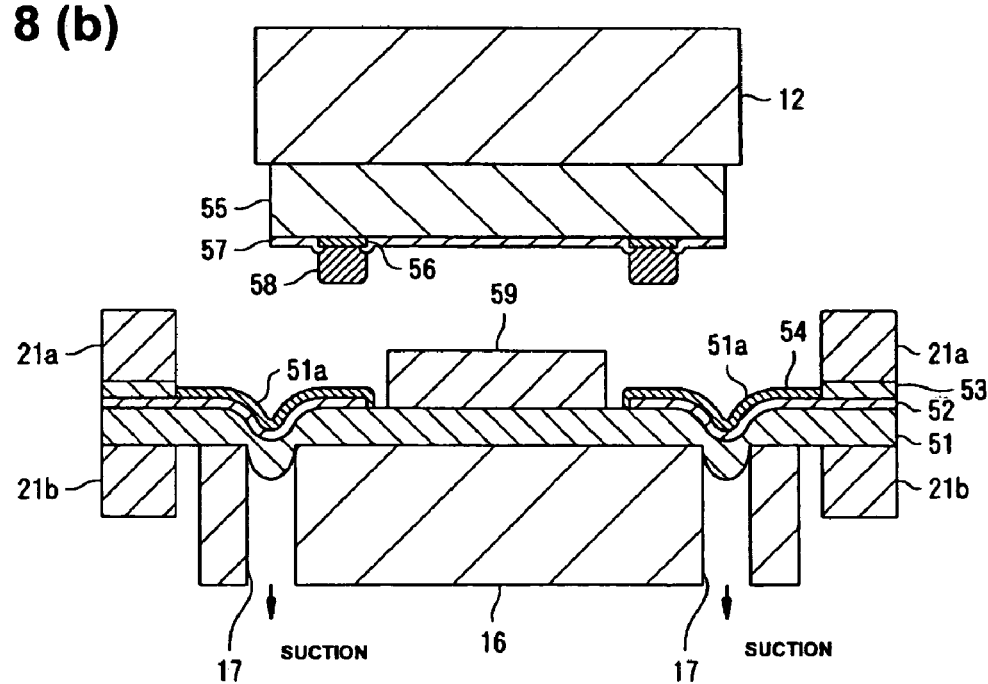
Figure 9:
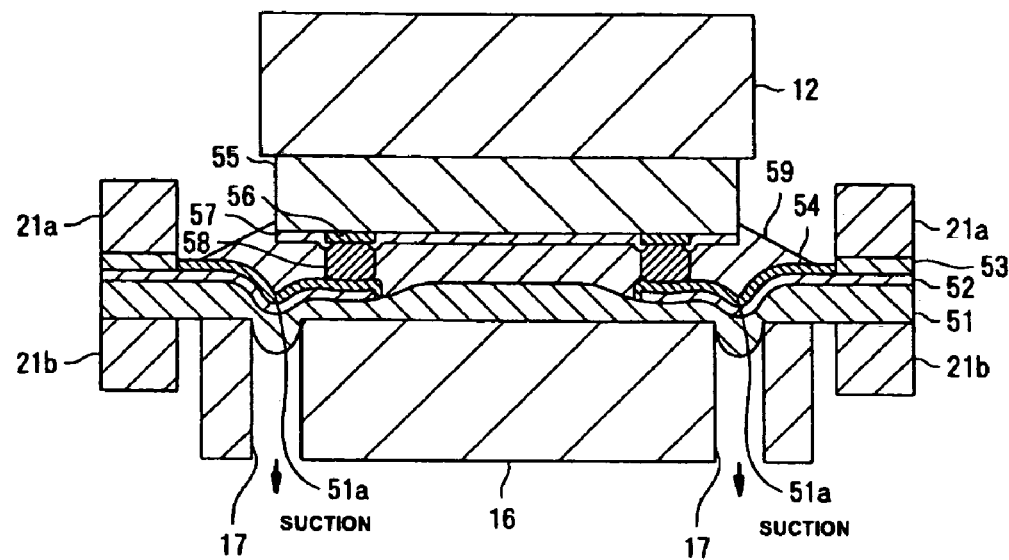
FIGS. 9(a) and (b) are cross-sectional views indicating the method for manufacturing a semiconductor device in accordance with the fourth embodiment of the present invention.
Figure 9:
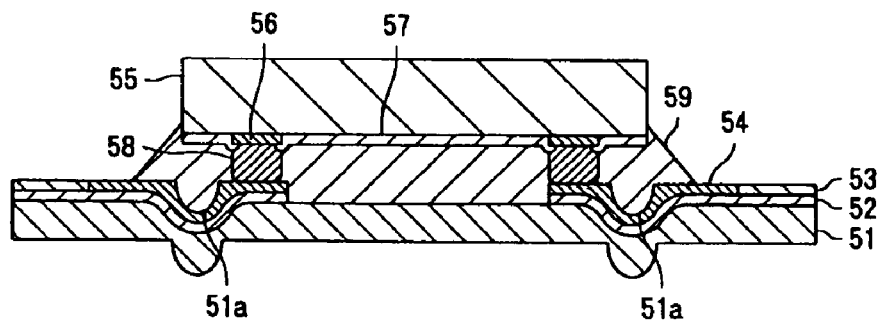

FIGS. 8 and 9 are cross-sectional views indicating a method for manufacturing a semiconductor device in accordance with a fourth embodiment of the present invention.

Referring to FIG. 8(a), Cu wiring layers 52 as inner leads are formed on a tape substrate 51, the circumference of the Cu wiring layer 52 is covered by a protection film 53, and exposed portions of the Cu wiring layers 52 are covered by Au plated layers 54.

On the other hand, pad electrodes 56 are provided on a semiconductor chip 55, the circumference of the pad electrodes 56 is covered by a protection film 57, and Au bump electrodes 58 are formed on the pad electrodes 56.

Then, when the tape substrate 51 is transferred, the tape pressing frame 21a is lowered, and the tape pressing frame 21b is raised, thereby clamping the tape substrate 51.

Then, while the bonding stage 16 is heated by the heater 15, the bonding stage 16 is pressed against the tape substrate 51, to thereby soften the tape substrate 51, and sealing resin 59 is coated inside the Cu wiring layers 52.

When pressing the bonding stage 16 against the tape substrate 51, the bonding stage 16 is positioned such that edge sections of the semiconductor chip 55 are positioned over the suction groove 17.

Then, as indicate in FIG. 8(b), by applying suction to the tape substrate 51 through the suction groove 17, boundary portions of the semiconductor chip mounting region are drawn into the suction groove 17, such that curved portions 51a are formed in the tape substrate 51 at positions corresponding to the edge sections of the semiconductor chip 55.

Then, as indicated in FIG. 9(a), the semiconductor chip 55 that is retained by suction by the bonding head 12 is transferred onto the tape substrate 51, and the Au bump electrodes 58 are pressed against the Cu wiring layers 52 that are covered with the Au plated layers 54, to thereby bond the Au bump electrodes 58 to the Au plated layers 54, and areas around the semiconductor chip 55 mounted on the tape substrate 51 are sealed with sealing resin 59.

Then, as indicated in FIG. 9(b), the bonding head 12 and the bonding stage 16 are removed, and the clamping by the tape pressing frames 21a and 21b is released.

Here, since the curved portions 51a are formed in the tape substrate 51 at locations corresponding to the edge sections of the semiconductor chip 55, even when the tape substrate 51 recedes at areas below the Au bump electrodes 58, a clearance between the edge sections of the semiconductor chip 55 and the tape substrate 51 can be secured.

Also, as the semiconductor chip 55 is mounted on the tape substrate 51 after coating the sealing resin 59 on the tape substrate 51, the semiconductor chip 55 can be sealed with the sealing resin 59 at the time of connecting the Au bump electrodes 58 and the Au plated layer 54.

For this reason, there is no need to seal the semiconductor chip 55 with sealing resin after the semiconductor chip 55 is mounted on the tape substrate 51, the clearance between the edge sections of the semiconductor chip 55 and the tape substrate 51 can be increased, the manufacturing process is simplified, the connection reliability between the semiconductor chip 55 and the tape substrate 51 can be improved, and poor contacts of the semiconductor chip 55 can be reduced.

FIGS. 10(a)–(d) are diagrams showing forming states of tape substrates in accordance with an embodiment of the present invention. FIG. 10(a) is a perspective view of a surface state of a tape substrate without forming, which is observed by a laser step meter, FIG. 10(b) is a cross-sectional view taken along lines A—A of FIG. 10(a), FIG. 10(c) is a perspective view of a surface state of a tape substrate with forming, which is observed by a laser step meter, and FIG. 10(d) is a cross-sectional view taken along lines B—B of FIG.10(c).

It is observed from FIG. 10(a) and FIG. 10(b) that the surface of a tape substrate is generally flat when the forming is not conducted on the tape substrate.

Figure 10:
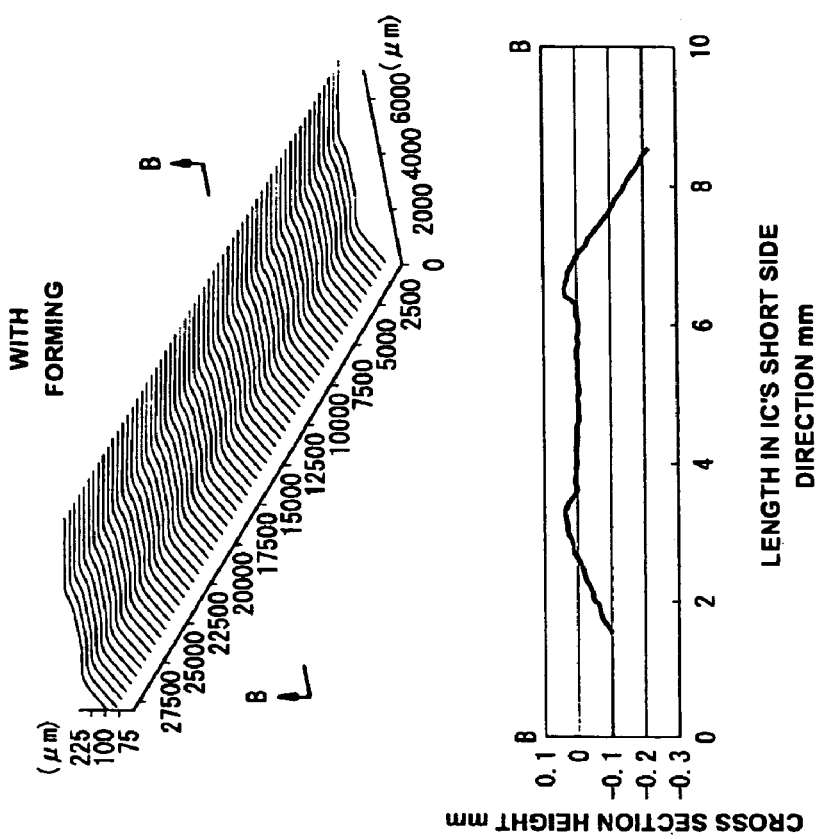
FIGS. 10(a)–(d) are diagrams showing forming states of tape substrates in accordance with an embodiment of the present invention.
Figure 10:
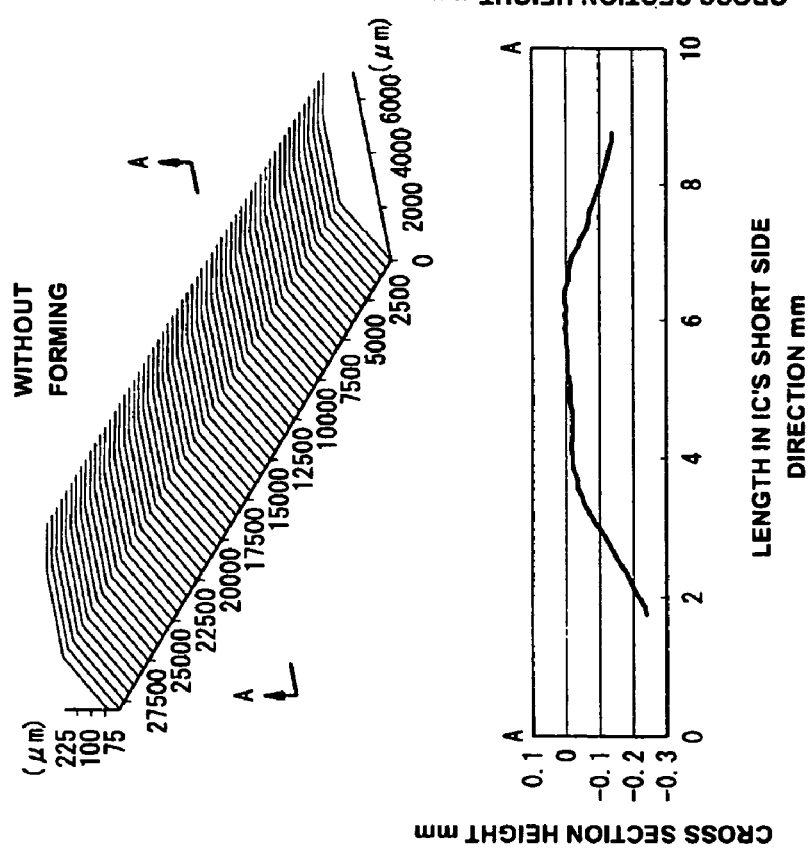

On the other hand, it is observed from FIG. 10(c) and FIG. 10 (d) that steps of about 20 μm are formed on a tape substrate when the forming on the tape is conducted through applying suction by the suction groove 17 and radiant heat from the bonding head 12 indicated in FIG. 1.

Consequently, by conducting forming on a tape substrate, concave sections disposed at locations corresponding to edge sections of a semiconductor chip are formed in the tape substrate, and the clearance between the edge sections of the semiconductor chip and the tape substrate can be increased.

Figure 11:
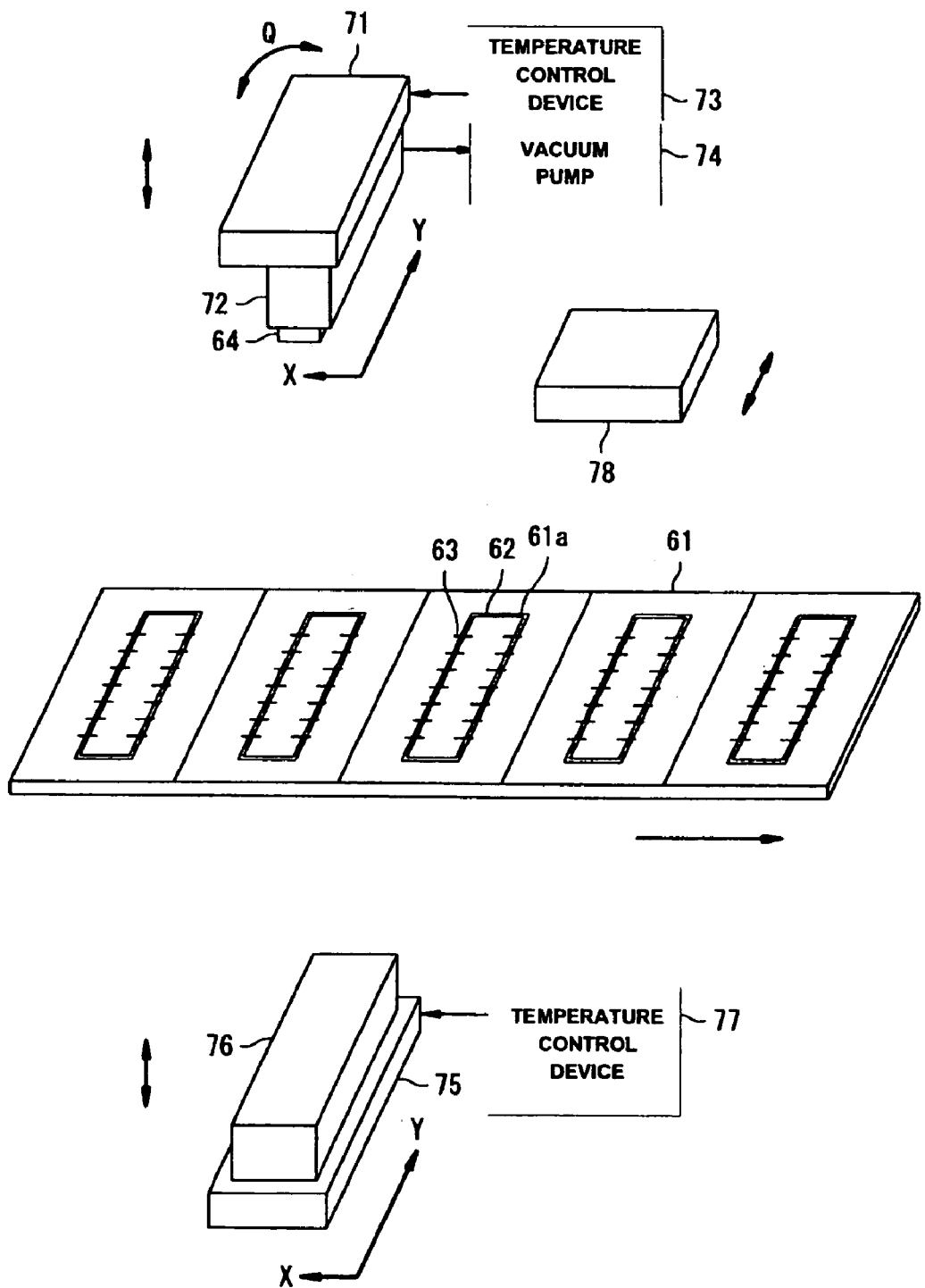
FIG. 11 schematically shows a perspective view of the structure of a semiconductor manufacturing device in accordance with a fifth embodiment of the present invention.

FIG. 11 schematically shows a perspective view of the structure of a semiconductor manufacturing device in accordance with a fifth embodiment of the present invention.

In FIG. 11, a tape substrate 61 is provided thereon with a semiconductor chip mounting region 62 for mounting a semiconductor chip 64, inner leads 63 formed in a manner to lie over the semiconductor chip mounting region 62, and further a concave section 61a formed at a boundary of the semiconductor chip mounting region 62.

Further, above the tape substrate 61, a bonding head 72 that adheres by suction to a semiconductor chip 64 is provided, and a heater 71 is attached to the bonding head 72. The bonding head 72 is connected to a vacuum pump 74 that applies suction to the semiconductor chip 64, and the heater 71 is connected to a temperature control device 73 that controls the temperature of the bonding head 72.

Also, above the tape substrate 61, a camera 78 that performs image recognition of the tape substrate 61 and the semiconductor chip 64 is provided, and the position of the bonding head 72 in its X and Y directions and rotation angle θ within the X-Y plane are controlled based on the image recognition result obtained by the camera 78.

Also, below the tape substrate 61, a bonding stage 76 that fixes the semiconductor chip mounting region 62 of the tape substrate 61 is provided, a heater 75 is attached to the bonding stage 76, the heater 75 is connected to a temperature control device 77 that controls the temperature of the bonding stage 76.

Figure 12:
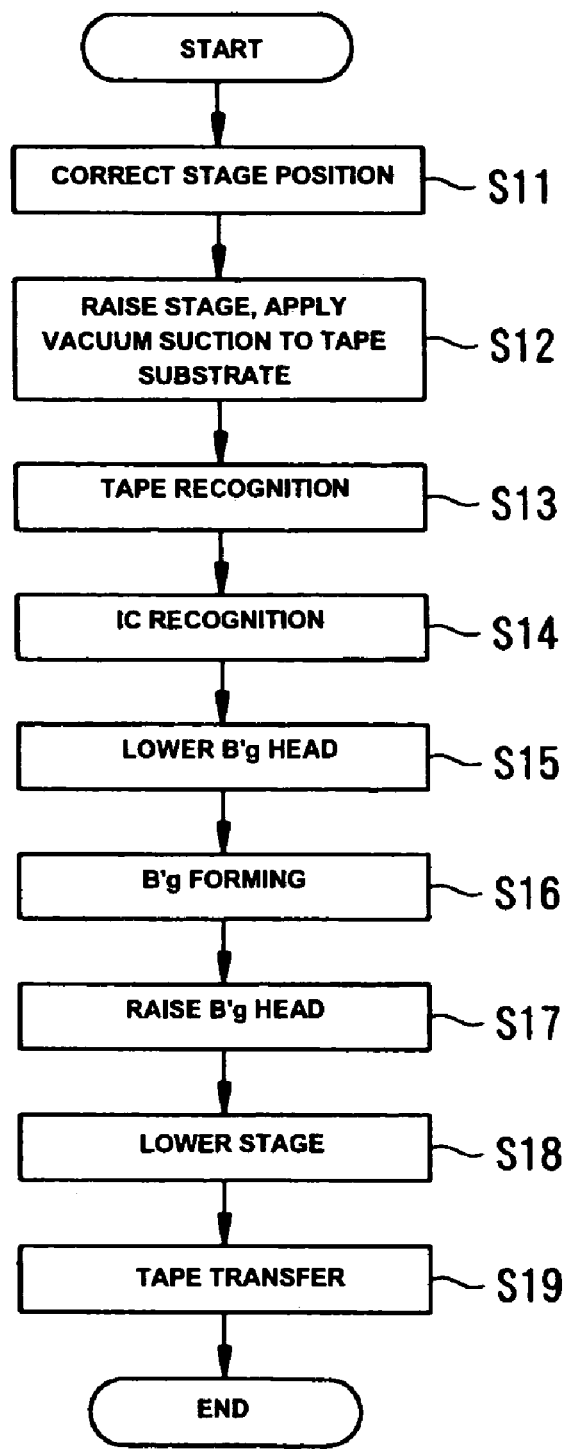
FIG. 12 is a flowchart indicating a method for manufacturing a semiconductor device in accordance with the fifth embodiment of the present invention.

FIG. 12 is a flowchart indicating a method for manufacturing a semiconductor device in accordance with the fifth embodiment of the present invention.

Referring to FIG. 12, the heater 71 is turned on, and the temperature of the bonding head 72 is adjusted by the temperature control device 73; and the vacuum pump 74 is turned on, such that the semiconductor chip 64 is retained by suction by the bonding head 72. Also, the heater 75 is turned on, and the temperature of the bonding stage 76 is controlled by the temperature control device 77.

Then, when the tape substrate 61 is transferred, and after the position of the bonding stage 76 is corrected (step S11), the bonding stage 76 is raised, to press the bonding stage 76 against the back surface of the tape substrate 61, and the tape substrate 61 is fixed by applying vacuum suction thereto (step S12).

Next, the camera 78 is moved over the bonding stage 76, and image recognition of the tape substrate 61 and the semiconductor chip 64 is conducted using the camera 78 (steps S13 and S14). Then, the position of the bonding head 72 is aligned in its X·Y·θ directions based on the result of the image recognition of the tape substrate 61 and the semiconductor chip 64.

Next, when the positioning of the bonding head 72 is completed, the bonding head 72 is lowered, and the semiconductor chip 64 that is retained by suction by the bonding stage 76 is mounted on the tape substrate 61 (step S15).

Here, since the concave section 61a is formed in advance at the boundary of the semiconductor chip mounting region 62, the tape substrate 61 can be kept away from the edge sections of the semiconductor chip 64 when the semiconductor chip 64 is mounted on the tape substrate 61, and the clearance between the edge sections of the semiconductor chip 64 and the tape substrate 61 can be increased.

Next, by using radiant heat radiating from the bonding head 72, the tape substrate 61 is subject to forming (step S16).

Next, when forming the tape substrate 61 is complete, the bonding head 72 is raised (step S17), the bonding stage 76 is lowered (step S18), and the tape substrate 61 is transferred (step S19).

Figure 13:
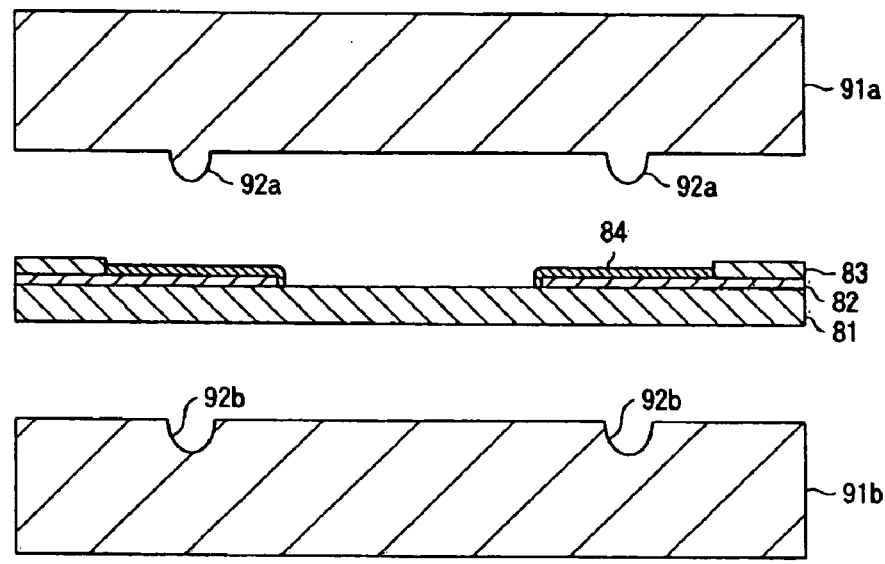
FIGS. 13(a) and (b) are cross-sectional views indicating a method for manufacturing a semiconductor device in accordance with a sixth embodiment of the present invention.
Figure 13:
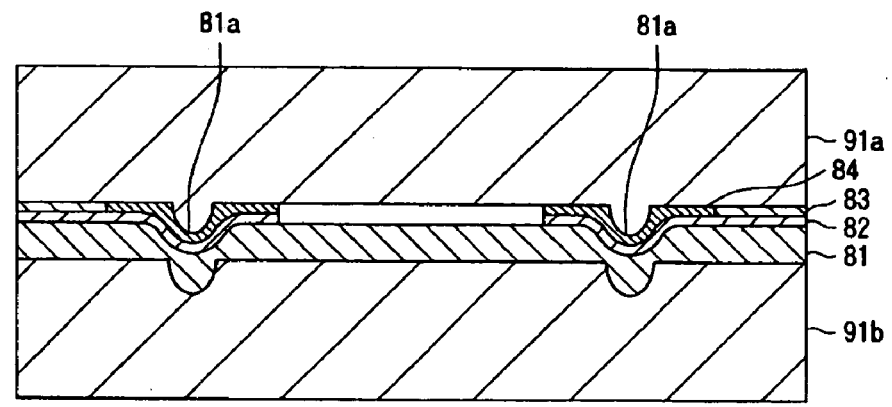
Figure 14:
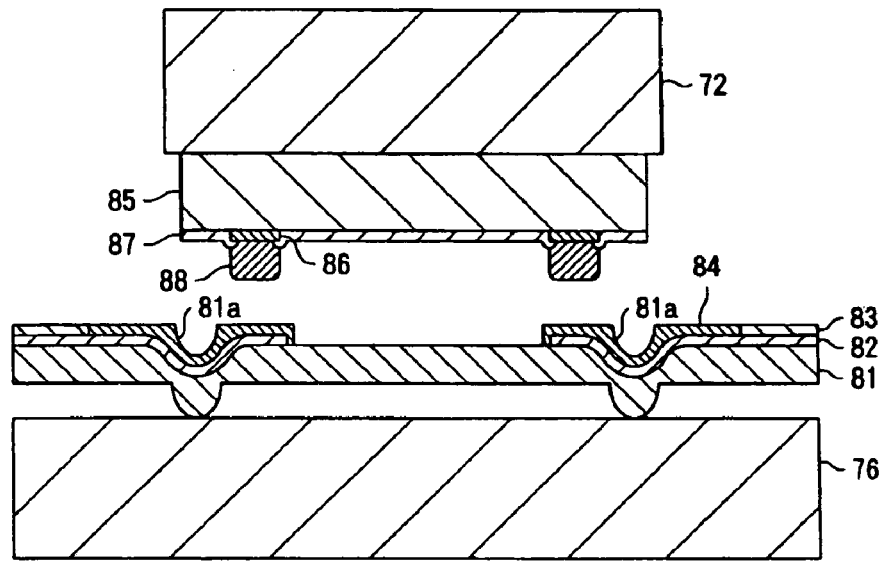
FIGS. 14(a) and (b) are cross-sectional views indicating the method for manufacturing a semiconductor device in accordance with the sixth embodiment of the present invention.
Figure 14:
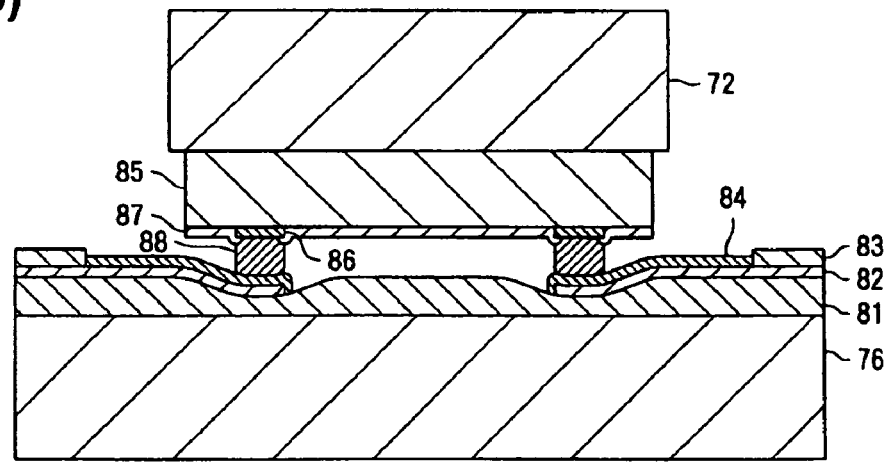
Figure 15:
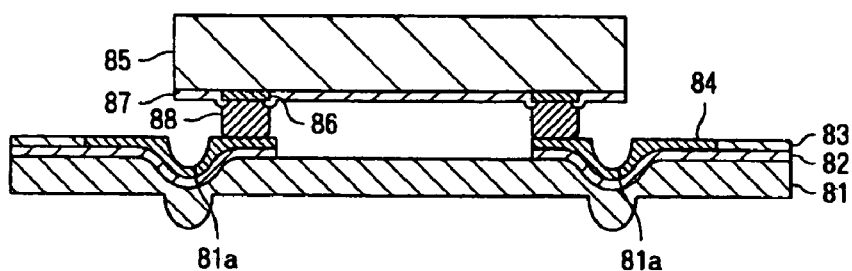
FIGS. 15(a) and (b) are cross-sectional views indicating the method for manufacturing a semiconductor device in accordance with the sixth embodiment of the present invention.
Figure 15:
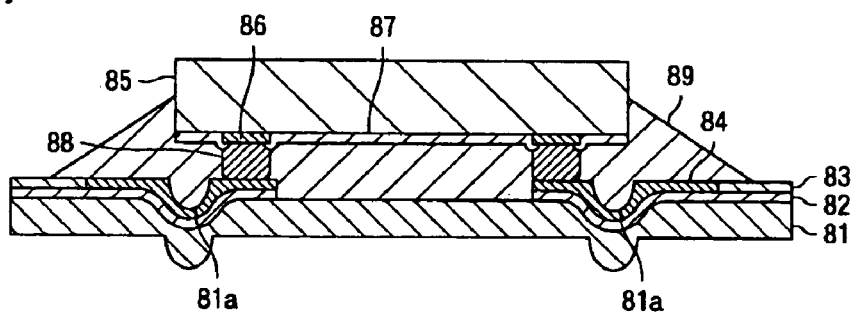
Figure 16:
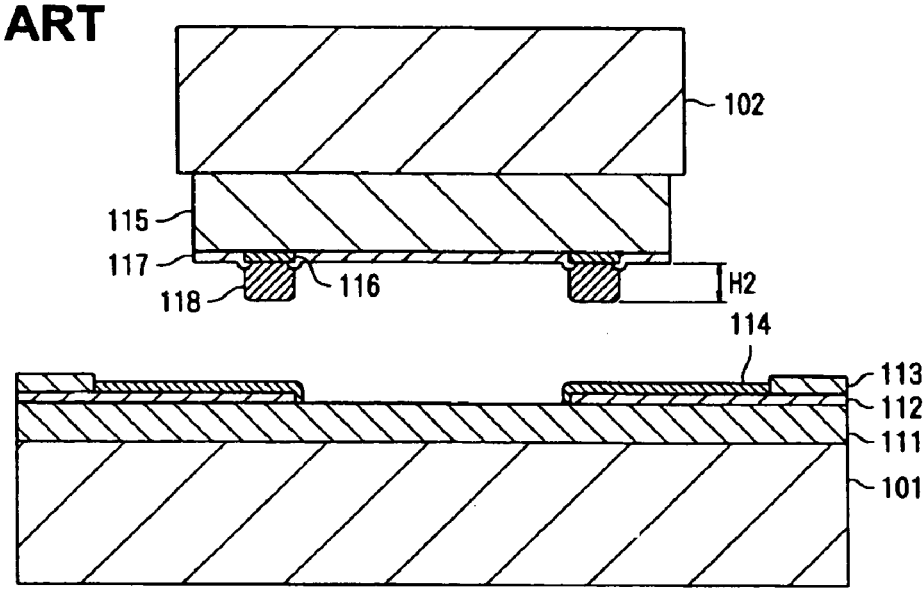
FIGS. 16(a) and (b) are cross-sectional views indicating a conventional method for manufacturing a semiconductor device.
Figure 16:
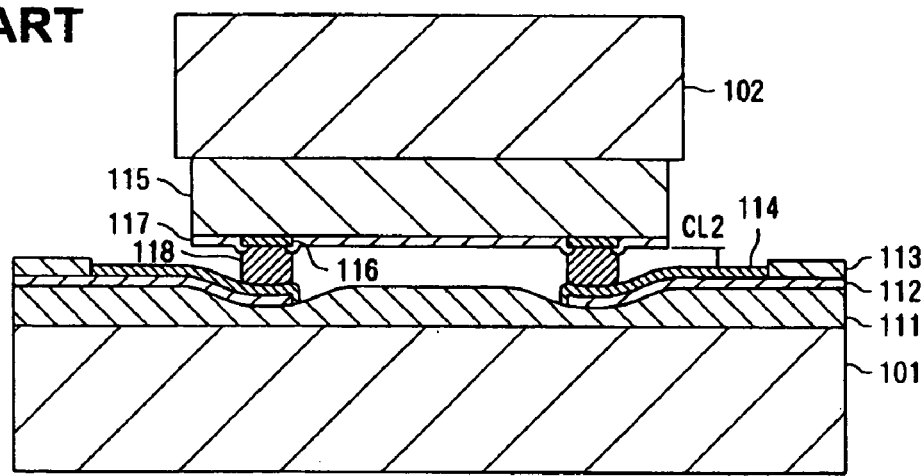

FIGS. 13 through 15 are cross-sectional views indicating a method for manufacturing a semiconductor device in accordance with a sixth embodiment of the present invention.

Referring to FIG. 13(a), Cu wiring layers 82 as inner leads are formed on a tape substrate 81, the circumference of the Cu wiring layer 82 is covered by a protection film 83, and exposed portions of the Cu wiring layers 82 are covered by Au plated layers 84.

On the other hand, convex sections 92a are formed on a metal mold 91a at positions corresponding to edge sections of a semiconductor chip 85, and concave sections 92b in which the convex sections 92a can be fitted are provided in a metal mold 91b.

Then, as indicated in FIG. 13(b), a tape substrate 81 is sandwiched by the metal molds 91a and 91b in a manner that the convex sections 92a are disposed at the boundary of the semiconductor chip mounting region of the tape substrate 81, to thereby form concave sections 81a in the tape substrate 81 at positions corresponding to the edge sections of the semiconductor chip 85.

On the other hand, as indicated in FIG. 14(a), pad electrodes 86 are provided on the semiconductor chip 85, the circumference of the pad electrodes 86 is covered by a protection film 87, and Au bump electrodes 88 are formed on the pad electrodes 86. Then, while heating the bonding stage 76 by a heater 75, the bonding stage 76 is pressed against the tape substrate 81 having the concave sections 81a formed therein.

Then, as indicated in FIG. 14(b), the semiconductor chip 85 that is retained by suction by the bonding head 72 is transferred over the tape substrate 81, and the Au bump electrodes 88 are pressed against the Cu wiring layers 82 covered by Au plated layers 84 to connect the Au bump electrodes 88 and the Au plated layers 84.

Then, as indicated in FIG. 15(a), the bonding head 72 and the bonding stage 76 are removed, and as indicated in FIG. 15(b), resin 89 is injected around the semiconductor chip 85 that is mounted on the tape substrate 81, to thereby seal the semiconductor chip 85.

As the concave sections 81a are formed in advance in the tape substrate 81 at locations corresponding to the edge sections of the semiconductor chip 85, even when the tape substrate 81 recedes at areas below the Au bump electrodes 88, a clearance between the edge sections of the semiconductor chip 85 and the tape substrate 81 can be secured.

Also, by forming the concave sections 81a in the tape substrate 81 by using the metal mode forming method, there is no need to soften the tape substrate 81 at the time of mounting the semiconductor chip 85, such that deformations of the tape substrate 81 can be suppressed at the time of mounting the semiconductor chip 85, and the semiconductor chip 85 can be stably mounted on the tape substrate 81.

Accordingly, the semiconductor chip 85 can be accurately mounted on the tape substrate 81, the height of the Au bump electrodes 88 can be lowered, the cost can be reduced, the connection reliability between the semiconductor chip 85 and the tape substrate 81 can be improved, and poor contact of the semiconductor chip 85 can be reduced.

Effects of the Invention

As described above, in accordance with the present invention, by composing a circuit substrate in a manner that the circuit substrate recedes away from edge sections of a semiconductor chip, the edge sections of the semiconductor chip can be prevented from contacting the circuit substrate without increasing the height of bump electrodes. Consequently, the material used for the bump electrodes can be reduced, such that the cost can be lowered, and the uniformity in the height of the bump electrodes is improved such that the connection reliability between the semiconductor chip and the circuit substrate can be improved.

What is claimed is:

1. A method for manufacturing a semiconductor device, comprising:
   a step for supporting a back surface of a circuit substrate by using a bonding stage having at least one of a groove and a hole disposed at a position corresponding to an edge position of a semiconductor chip;

a step of applying suction to the at least one of the groove and the hole provided in the bonding stage, wherein the suction pulls a substrate formed on the at least one of the groove and the hole downward;

a step of mounting the semiconductor chip on the circuit substrate while applying suction to the at least one of the groove and the hole; and a step of sealing with resin the semiconductor chip mounted on the circuit substrate.

2. A method for manufacturing a semiconductor device according to claim 1, further comprising a step of heating the circuit substrate when applying suction to the at least one of the groove and the hole.

3. A method for manufacturing a semiconductor device, comprising:

a step of coating resin in a region inside inner leads on a circuit substrate;

a step for supporting a back surface of the circuit substrate by using a bonding stage having at least one of a groove and a hole disposed at a position corresponding to an edge position of a semiconductor chip;

a step of applying suction to the at least one of the groove and the hole provided in the bonding stage, wherein the suction pulls a substrate formed on the at least one of the groove and the hole downward; and a step of mounting the semiconductor chip on the circuit substrate while applying suction to the at least one of the groove and the hole.

4. A method for manufacturing a semiconductor device according to claim 3, further comprising a step of heating the circuit substrate when applying suction to the at least one of the groove and the hole.

5. A method for manufacturing a semiconductor device, comprising:

a step for supporting a back surface of a circuit substrate by using a bonding stage having at least one of a groove and a hole disposed at a position corresponding to an edge position of a semiconductor chip;

a step of mounting the semiconductor chip on the circuit substrate; and a step of applying suction to the at least one of the groove and the hole provided in the bonding stage, after mounting the semiconductor chip, wherein the suction pulls a substrate formed on the at least one of the groove and the hole downward.

6. A method for manufacturing a semiconductor device according to claim 5, further comprising a step of heating the circuit substrate when applying suction to the at least one of the groove and the hole.

7. A method for manufacturing a semiconductor device comprising:

a step of transferring a tape substrate;

a step of clamping the transferred tape substrate;

a step of performing image recognition of the tape substrate;

a step of positioning a bonding stage that supports the tape substrate in X·Y·θ directions based on a result of the image recognition of the tape substrate;

a step of pressing the positioned bonding stage against a back surface of the tape substrate;

a step of applying suction to a region of a semiconductor chip corresponding to an edge position thereof through at least one of a groove and a hole provided in the bonding stage;

a step of performing image recognition of the tape substrate pressed against the bonding stage and the semiconductor chip;

a step of positioning a bonding head that retains the semiconductor chip in X·Y·θ directions based on a result of the image recognition of the tape substrate and the semiconductor chip;

a step of pressing the semiconductor chip that is retained by the bonding head positioned against the tape substrate;

a step of forming the tape substrate by using radiant heat radiating from the bonding head;

a step of releasing the pressing of the bonding head;

a step of releasing the pressing of the bonding stage; and a step of releasing the clamping.

* * * * *